(12) United States Patent
Olac-Vaw et al.

(10) Patent No.: US 12,191,207 B2
(45) Date of Patent: *Jan. 7, 2025

(54) NON-PLANAR I/O AND LOGIC SEMICONDUCTOR DEVICES HAVING DIFFERENT WORKFUNCTION ON COMMON SUBSTRATE

(71) Applicant: Intel Corporation, Santa Clara, CA (US)

(72) Inventors: Roman W. Olac-Vaw, Hillsboro, OR (US); Walid M. Hafez, Portland, OR (US); Chia-Hong Jan, Portland, OR (US); Pei-Chi Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,983

(22) Filed: Oct. 11, 2023

(65) Prior Publication Data

US 2024/0038592 A1  Feb. 1, 2024

Related U.S. Application Data

(63) Continuation of application No. 17/720,150, filed on Apr. 13, 2022, now Pat. No. 11,823,954, which is a
(Continued)

(51) Int. Cl.
*H01L 27/12* (2006.01)
*H01L 21/28* (2006.01)
(Continued)

(52) U.S. Cl.
CPC .. *H01L 21/82345* (2013.01); *H01L 21/28088* (2013.01); *H01L 21/823431* (2013.01);
(Continued)

(58) Field of Classification Search
CPC ......... H01L 21/82345; H01L 21/28088; H01L 21/823431; H01L 21/823475;
(Continued)

(56) References Cited

U.S. PATENT DOCUMENTS 6,373,111 B1 * 4/2002 Zheng ................... H01L 27/088
257/E27.06
7,176,531 B1 * 2/2007 Xiang ................. H01L 29/4966
257/E21.639
(Continued)

FOREIGN PATENT DOCUMENTS

CN   102779743      11/2012
CN   103094211 A    5/2013
(Continued)

OTHER PUBLICATIONS

Office Action from Taiwan Patent Application No. 112145410 mailed Dec. 29, 2023, 4 pgs.
(Continued)

*Primary Examiner* — Earl N Taylor
(74) *Attorney, Agent, or Firm* — Schwabe, Williamson & Wyatt P.C.

(57) ABSTRACT

Non-planar I/O and logic semiconductor devices having different workfunctions on common substrates and methods of fabricating non-planar I/O and logic semiconductor devices having different workfunctions on common substrates are described. For example, a semiconductor structure includes a first semiconductor device disposed above a substrate. The first semiconductor device has a conductivity type and includes a gate electrode having a first workfunction. The semiconductor structure also includes a second semiconductor device disposed above the substrate. The
(Continued)

second semiconductor device has the conductivity type and includes a gate electrode having a second, different, work-function.

20 Claims, 5 Drawing Sheets

Related U.S. Application Data continuation of application No. 17/112,959, filed on Dec. 4, 2020, now Pat. No. 11,335,601, which is a continuation of application No. 15/930,700, filed on May 13, 2020, now Pat. No. 10,892,192, which is a continuation of application No. 16/253,760, filed on Jan. 22, 2019, now Pat. No. 10,692,771, which is a continuation of application No. 14/914,179, filed as application No. PCT/US2013/062308 on Sep. 27, 2013, now Pat. No. 10,229,853.

(51) Int. Cl.
    H01L 21/8234      (2006.01)
    H01L 21/8238      (2006.01)
    H01L 21/84        (2006.01)
    H01L 23/528       (2006.01)
    H01L 27/088       (2006.01)
    H01L 29/49        (2006.01)
    H01L 29/78        (2006.01)
    H01L 29/66        (2006.01)

(52) U.S. Cl.
    CPC ........... *H01L 21/823475* (2013.01); *H01L 21/823821* (2013.01); *H01L 21/823842* (2013.01); *H01L 21/845* (2013.01); *H01L 23/5283* (2013.01); *H01L 27/0886* (2013.01); *H01L 27/1211* (2013.01); *H01L 29/4966* (2013.01); *H01L 29/7855* (2013.01); *H01L 29/66545* (2013.01)

(58) Field of Classification Search
    CPC ..... H01L 21/823821; H01L 21/823842; H01L 21/845; H01L 23/5283; H01L 27/0886; H01L 27/1211; H01L 29/4966; H01L 29/7855; H01L 29/66545
    See application file for complete search history.

(56) References Cited

U.S. PATENT DOCUMENTS

| | | | | |
|---|---|---|---|---|
| 8,384,160 | B2* | 2/2013 | Onishi | H01L 21/823462 257/E27.098 |
| 8,659,084 | B1* | 2/2014 | Chang | H01L 21/82385 438/289 |
| 9,496,261 | B2* | 11/2016 | Shifren | H01L 21/823807 |
| 9,525,036 | B2* | 12/2016 | Bae | H01L 29/6656 |
| 9,570,614 | B2 | 2/2017 | Pillarisetty et al. | |
| 10,229,853 | B2* | 3/2019 | Olac-Vaw | H01L 21/82345 |
| 10,692,771 | B2* | 6/2020 | Olac-Vaw | H01L 27/1211 |
| 10,892,192 | B2* | 1/2021 | Olac-Vaw | H01L 21/823475 |
| 11,335,601 | B2* | 5/2022 | Olac-Vaw | H01L 23/5283 |
| 11,823,954 | B2* | 11/2023 | Olac-Vaw | H01L 27/0886 |
| 2003/0219953 | A1* | 11/2003 | Mayuzumi | H01L 21/82345 438/353 |
| 2006/0008973 | A1* | 1/2006 | Phua | H01L 21/823857 257/E21.639 |
| 2006/0163662 | A1* | 7/2006 | Kinoshita | H01L 21/28097 257/E21.426 |
| 2006/0264831 | A1* | 11/2006 | Skwarek | A61M 3/0202 604/151 |
| 2007/0045695 | A1* | 3/2007 | Takeoka | H01L 21/82345 257/296 |
| 2007/0052037 | A1* | 3/2007 | Luan | H01L 21/823842 257/E29.151 |
| 2007/0075351 | A1* | 4/2007 | Schulz | H01L 27/1211 257/E21.639 |
| 2008/0050870 | A1* | 2/2008 | Yamamoto | H01L 21/28061 438/230 |
| 2008/0093699 | A1* | 4/2008 | Abe | H01L 29/105 257/E27.098 |
| 2009/0108368 | A1* | 4/2009 | Kanegae | H01L 21/823842 257/E21.177 |
| 2009/0200616 | A1* | 8/2009 | Shimizu | H01L 21/823857 257/369 |
| 2009/0209074 | A1* | 8/2009 | Anderson | H01L 29/7856 438/283 |
| 2010/0087038 | A1* | 4/2010 | Chung | H01L 21/823842 257/E21.632 |
| 2010/0112811 | A1 | 5/2010 | Yeh et al. | |
| 2010/0164009 | A1* | 7/2010 | Park | H01L 21/823842 257/E27.06 |
| 2010/0184260 | A1* | 7/2010 | Luo | H01L 29/513 257/E21.598 |
| 2011/0108922 | A1* | 5/2011 | Liu | H01L 27/092 257/E21.632 |
| 2011/0127610 | A1* | 6/2011 | Lee | H01L 21/823431 257/E27.06 |
| 2011/0147837 | A1 | 6/2011 | Hafez et al. | |
| 2011/0147937 | A1 | 6/2011 | Kubota | |
| 2012/0018813 | A1* | 1/2012 | Holmes | H01L 21/823431 257/E27.061 |
| 2012/0129331 | A1* | 5/2012 | Choi | H01L 21/32139 257/E21.19 |
| 2012/0132998 | A1* | 5/2012 | Kwon | H01L 21/823857 257/E21.409 |
| 2012/0153387 | A1* | 6/2012 | Murthy | H01L 29/785 257/E21.409 |
| 2012/0280330 | A1* | 11/2012 | Lee | H01L 21/823431 257/E27.06 |
| 2012/0289040 | A1* | 11/2012 | Huang | H01L 21/823842 438/585 |
| 2012/0292715 | A1 | 11/2012 | Hong | |
| 2012/0313188 | A1* | 12/2012 | Kanegae | H01L 29/7833 257/412 |
| 2013/0062672 | A1* | 3/2013 | Zhu | H01L 21/845 257/288 |
| 2013/0065371 | A1* | 3/2013 | Wei | H01L 21/76897 257/E21.546 |
| 2013/0154016 | A1* | 6/2013 | Glass | H01L 29/785 438/285 |
| 2013/0175611 | A1* | 7/2013 | Shinohara | H01L 21/823857 257/334 |
| 2013/0187235 | A1* | 7/2013 | Huang | H01L 29/0649 438/587 |
| 2013/0187236 | A1* | 7/2013 | Xie | H01L 29/66553 257/369 |
| 2013/0200467 | A1* | 8/2013 | Edge | H01L 21/823842 257/E27.06 |
| 2013/0221441 | A1* | 8/2013 | Jagannathan | H01L 21/823842 257/350 |
| 2013/0224936 | A1* | 8/2013 | Lee | H01L 21/823431 438/492 |
| 2013/0228872 | A1* | 9/2013 | Bajaj | H01L 21/845 257/369 |
| 2013/0240989 | A1 | 9/2013 | Glass | |
| 2013/0248952 | A1* | 9/2013 | Rosenbaum | H01L 29/6656 438/585 |
| 2013/0249019 | A1* | 9/2013 | Kelly | H01L 29/7851 257/402 |
| 2013/0264639 | A1 | 10/2013 | Glass | |
| 2013/0264652 | A1* | 10/2013 | Zhu | H01L 21/823842 257/369 |
| 2013/0270639 | A1* | 10/2013 | Lee | H01L 27/1211 257/347 |
| 2013/0299922 | A1* | 11/2013 | Choi | H01L 29/4966 438/585 |
| 2013/0309857 | A1* | 11/2013 | Koburger, III | H01L 21/845 438/591 |

(56) References Cited

U.S. PATENT DOCUMENTS

| | | | | |
|---|---|---|---|---|
| 2013/0313648 | A1* | 11/2013 | Chiang | H01L 29/6659 257/E27.06 |
| 2013/0334608 | A1* | 12/2013 | Ikoma | H01L 21/82345 257/368 |
| 2014/0027859 | A1* | 1/2014 | Gerhardt | H01L 21/28202 257/E27.06 |
| 2014/0061814 | A1* | 3/2014 | Kim | H01L 21/823462 257/369 |
| 2014/0065802 | A1* | 3/2014 | Chang | H01L 27/1211 438/479 |
| 2014/0070320 | A1* | 3/2014 | Mukherjee | H01L 21/823456 438/585 |
| 2014/0070414 | A1* | 3/2014 | Hartig | H01L 21/823456 438/669 |
| 2014/0308808 | A1* | 10/2014 | Cheng | H01L 21/823842 438/595 |
| 2014/0319623 | A1* | 10/2014 | Tsai | H01L 21/823431 438/588 |
| 2014/0329380 | A1* | 11/2014 | Cheng | H01L 21/28008 438/587 |
| 2014/0329388 | A1* | 11/2014 | Jang | H01L 21/28141 438/702 |
| 2015/0001689 | A1* | 1/2015 | Goetz | H01L 21/6835 257/659 |
| 2015/0082441 | A1* | 3/2015 | Gathala | H04L 63/1441 726/25 |
| 2015/0102416 | A1* | 4/2015 | Yin | H01L 21/28088 257/369 |
| 2015/0340461 | A1* | 11/2015 | Wei | H01L 21/28247 257/412 |
| 2016/0204246 | A1* | 7/2016 | Pillarisetty | H01L 21/823437 438/283 |
| 2016/0225671 | A1* | 8/2016 | Olac-Vaw | H01L 23/5283 |
| 2016/0276449 | A1 | 9/2016 | Bae | |
| 2019/0157153 | A1 | 5/2019 | Olac-Vaw | |
| 2020/0273752 | A1 | 8/2020 | Olac-Vaw et al. | |
| 2021/0090956 | A1 | 3/2021 | Olac-Vaw et al. | |
| 2022/0238383 | A1* | 7/2022 | Olac-Vaw | H01L 21/28088 |

FOREIGN PATENT DOCUMENTS

| | | |
|---|---|---|
| JP | 2002289871 | 10/2002 |
| JP | 2004356472 | 12/2004 |
| JP | 2007149942 | 6/2007 |
| JP | 2008085205 | 4/2008 |
| TW | I329926 | 9/2010 |
| TW | 201334158 | 8/2013 |
| TW | I715924 B | 1/2021 |
| WO | WO-2013101007 | 7/2013 |

OTHER PUBLICATIONS

Office Action from Korean Patent Application No. 10-2023-7005598 mailed Oct. 17, 2023, 5 pgs.
Office Action for Chinese Patent Application No. 201380079015.5, mailed Apr. 18, 2018, 7 pages.
Extended European Search Report for European Patent Application No. 13894123.2 mailed Apr. 18, 2017, whole document.
International Search Report and Written Opinion for PCT/US2013/062308, mailed Jun. 17, 2014, 13 pages.
International Preliminary Report on Patentability for PCT/US2013/062308, mailed Apr. 7, 2016, 10 pages.
Office Action for Taiwan Patent Application No. 103133276, mailed Jan. 25, 2016, 22 pages.
Office Action for Taiwan Patent Application No. 103133276, mailed Sep. 19, 2016, 15 pages.
Notice of Allowance for Taiwan Patent Application No. 103133276, mailed Apr. 18, 2017, 2 pages.
Office Action for Taiwan Patent Application No. 106116731, mailed Apr. 27, 2018 20 pages.
Office Action for Malaysian Patent Application No. PI2016700648, mailed Jul. 13, 2016, 2 pages.
Office Action for Taiwan Patent Application No. 10106116731, mailed Nov. 29, 2018, 21 pages.
Office Action for Chinese Patent Application No. 201380079015.5, mailed Oct. 17, 2018, 6 pages.
Office Action from Chinese Patent Application No. 201380079015.5, mailed Mar. 6, 2019, 6 pgs.
Office Action for European Patent Application No. 13894123.2, mailed Feb. 12, 2019, 7 pgs.
Search Report for European Patent Application No. 18195368.8, mailed Feb. 13, 2019, 7 pgs.
Notice of Allowance for Taiwan Patent Application No. 106116731, mailed Apr. 22, 2019, 3 pgs.
Office Action for Chinese Patent Application No. 201380079015.5, mailed Jul. 8, 2019, 4 pages.
Office Action for Korean Patent Application No. 10-2016-7002868, mailed Jul. 22, 2019, 5 pages.
Notice of Allowance from European Patent Application No. 13894123.2, mailed Oct. 28, 2019, 7 pages.
Notice of Allowance from Chinese Patent Application No. 201380079015.5, mailed Oct. 29, 2019, 4 pages.
Office Action from Korean Patent Application No. 10-2016-7002868, mailed Nov. 30, 2019, 7 pages.
Office Action from Taiwan Patent Application No. 108103344.0, mailed Feb. 18, 2020, 25 pages.
Office Action from Malaysian Patent Application No. PI2016700648, mailed Mar. 10, 2020, 3 pgs.
Office Action from Taiwan Patent Application No. 108103344.0, mailed Jun. 22, 2020, 25 pages.
Office Action from Korean Patent Application No. 10-2016-7002868, mailed Aug. 11, 2020, 4 pages.
Office Action from Korean Patent Application No. 10-2016-7002868, mailed Jun. 30, 2020, 5 pages.
Notice of Allowance from Taiwan Patent Application No. 108103344.0, mailed Nov. 9, 2020, 25 pages.
Office Action from Korean Patent Application No. 10-2020-7026343, mailed Nov. 24, 2020, 5 pages.
Office Action from Korean Patent Application No. 10-2020-7026343, mailed Apr. 16, 2021, 1 page.
Office Action from Korean Patent Application No. 10-2020-7026343, mailed Jan. 30, 2021, 5 pages.
Notice of Allowance for European Patent Application No. 18195368.8, mailed Feb. 4, 2021, 2 pgs.
Office Action from Korean Patent Application No. 10-2020-7026343, mailed Mar. 31, 2021, 10 page.
Office Action from Taiwan Patent Application No. 109114056, mailed Apr. 28, 2021, 8 pages.
Search Report for European Patent Application No. 20216602.1, mailed May 10, 2021, 9 pgs.
Notice of Allowance for Malaysian Patent Application No. PI2016700648, mailed Jun. 18, 2021, 1 pages.
Office Action from Korean Patent Application No. 10-2021-7009644, mailed Jul. 21, 2021, 3 pgs., no translation.
IPTAB Decision from Korean Patent Application No. 10-2020-7026343, mailed Jun. 30, 2021, 11 pgs., no translation.
Office Action from Taiwan Patent Application No. 109114056.0, mailed Oct. 6, 2021, 6 pgs.
Notice of Allowance from Taiwan Patent Application No. 109114056.0, mailed Nov. 30, 2021, 5 pgs.
Notice of Allowance from Taiwan Patent Application No. 109114056.0, mailed Feb. 24, 2022, 5 pgs., with English translation.
Office Action from Korean Patent Application No. 10-2021-7009644, mailed Jan. 26, 2022, 6 pgs., with English translation.
Office Action from Chinese Patent Application No. 201811024602.5, mailed Jul. 20, 2022, 10 pgs., no translation.
Final Office Action from Korean Patent Application No. 10-2021-7009644, mailed Jul. 25, 2022, 4 pgs., with English summary translation.
Notice of Allowance from Chinese Patent Application No. 201811024602.5, mailed Jan. 20, 2023, 4 pgs.
Office Action from Korean Patent Application No. 10-2021-7009644, mailed Nov. 25, 2022, 3 pgs.

(56) References Cited

OTHER PUBLICATIONS

Notice of Allowance from European Patent Application No. 20216602.1, mailed Apr. 14, 2023, 8 pgs.
Notice of Allowance from Taiwan Patent Application No. 111119150, mailed Aug. 31, 2023, 5 pgs., with English translation.
Notice of Allowance from Taiwan Patent Application No. 112145410, mailed Jul. 7, 2024, 5 pgs.
Office Action from Korean Patent Application No. 10-2023-7005598, mailed Jun. 27, 2024, 6 pgs.

\* cited by examiner

NON-PLANAR I/O AND LOGIC SEMICONDUCTOR DEVICES HAVING DIFFERENT WORKFUNCTION ON COMMON SUBSTRATE

CLAIM OF PRIORITY

This application is a continuation of U.S. patent application Ser. No. 17/720,150, filed Apr. 13, 2022, which is a continuation of U.S. patent application Ser. No. 17/112,959, filed Dec. 4, 2020, now U.S. Pat. No. 11,335,601, issued May 17, 2022, which is a continuation of U.S. patent application Ser. No. 15/930,700, filed May 13, 2020, now U.S. Pat. No. 10,892,192, issued Jan. 12, 2021, which is a continuation of U.S. patent application Ser. No. 16/253,760, filed Jan. 22, 2019, now U.S. Pat. No. 10,692,771, issued Jun. 23, 2020, which is a continuation of U.S. patent application Ser. No. 14/914,179, filed Feb. 24, 2016, now U.S. Pat. No. 10,229,853, issued Mar. 12, 2019, which is a U.S. National Phase application under 35 U.S.C. § 371 of International Application No. PCT/US2013/062308, filed Sep. 27, 2013, entitled "NON-PLANAR I/O AND LOGIC SEMICONDUCTOR DEVICES HAVING DIFFERENT WORKFUNCTION ON COMMON SUBSTRATE" the entire contents of which are incorporated herein by reference.

TECHNICAL FIELD

Embodiments of the invention are in the field of semiconductor devices and processing and, in particular, non-planar I/O and logic semiconductor devices having different workfunctions on common substrates and methods of fabricating non-planar I/O and logic semiconductor devices having different workfunctions on common substrates.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as fin field effect transistors (fin-FETs), have become more prevalent as device dimensions continue to scale down. In conventional processes, fin-FETs are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 2A illustrates an incomplete semiconductor structure having a hardmask form in gate electrode regions of a logic transistor, but not in gate electrode regions of an I/O transistor;

FIG. 2B illustrates the structure of FIG. 2A having the portion of the workfunction metal layer at gate electrode regions of the I/O transistor removed;

FIG. 2C illustrates the structure of FIG. 2B having a second workfunction metal layer and a second hardmask layer formed thereon;

FIG. 2D illustrates the structure of FIG. 2C following recessing of the second hardmask layer;

FIG. 2E illustrates the structure of FIG. 2D following removal of exposed portions of the second workfunction layer; and FIG. 2F illustrates the structure of FIG. 2E following removal of remaining portions of the hardmask layer and second hardmask layer.

DESCRIPTION OF THE EMBODIMENTS

Non-planar I/O and logic semiconductor devices having different workfunctions on common substrates and methods of fabricating non-planar I/O and logic semiconductor devices having different workfunctions on common substrates are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to approaches to of fabricating multiple workfunctions (WF) for different pitches of semiconductor devices fabricated on a common substrate. Applications may be in the fabrication of metal oxide semiconductor (MOS) and structures having both I/O transistors (e.g., drive transistor) and logic transistors (e.g., computation transistors) fabricated from a shared process scheme on a common substrate. In an example, the I/O transistors are fabricated to have a larger gate length and different workfunction as compared to the corresponding logic transistors.

To provide context, presently, the performances of different devices in system on chip (SoC) integrated circuits are controlled by different pitch, critical dimension (CD) and implant tailoring. However, all devices of a same conductivity type (e.g., N-type of P-type) typically have a same work function (WF). By contrast, one or more embodiments described herein provides an approach to patterning different work functions for different devices, enabling independent control performance of each device type.

More specifically, one or more embodiments take advantage of an etch rate dependence of a carbon hard mask (CHM) between different structures with different CDs (e.g., a wider CD has faster etch rate than a narrower CD). As such, different workfunction layers (such as metal gate layers) can be patterned for different devices (e.g., I/O versus logic devices). One or more embodiments, then, provide an opportunity to achieve different actual gate workfunctions for like devices (e.g., N-type devices) having differing function, e.g., an I/O device versus a logic device. By differentiating the workfunction between devices, the performance of each device can be independently targeted without use of any additional mask operations.

Figure 1A:
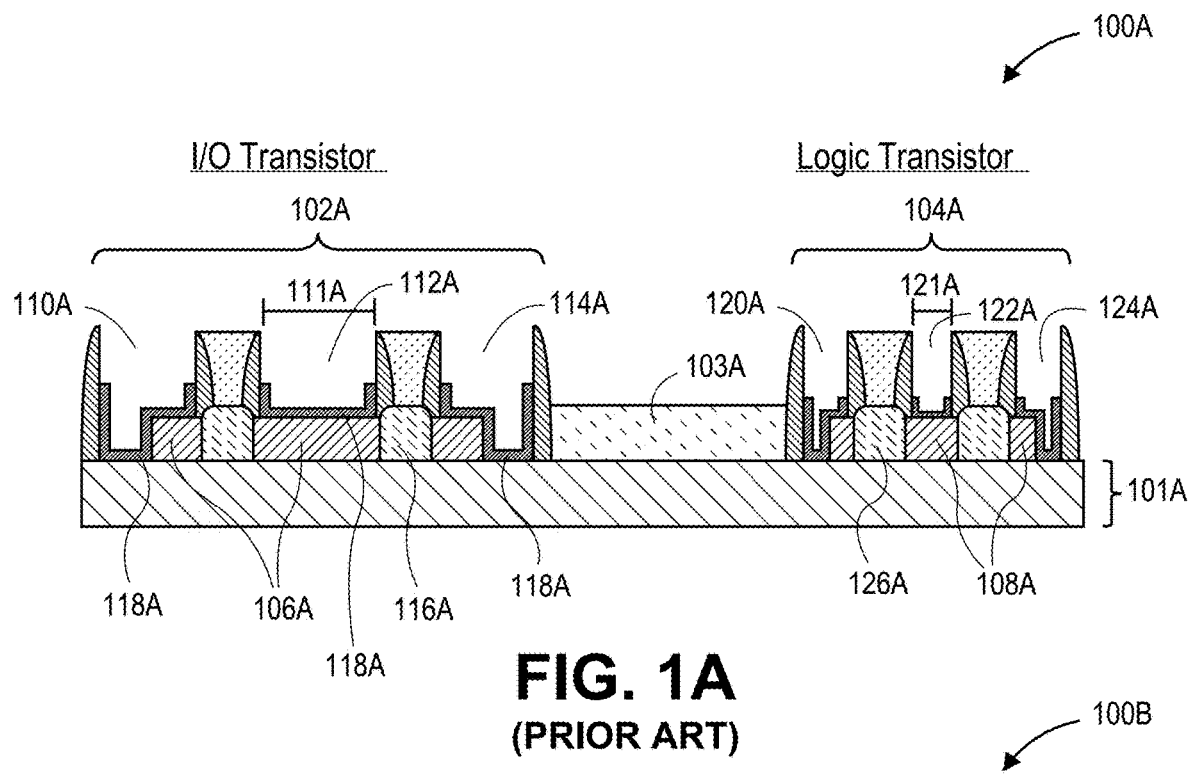
FIG. 1A illustrates a cross-sectional view of an incomplete portion of a semiconductor structure having an I/O transistor and a logic transistor disposed on a common substrate.

Previous approaches for providing different effective gate workfunctions for like devices (e.g., N-type devices) having differing function, e.g., an I/O device versus a logic device, have involved the use of substrate implant differentiation to control the performance of different devices. As an example, FIG. 1A illustrates a cross-sectional view of an incomplete portion of a semiconductor structure 100A having an I/O transistor 102A and a logic transistor 104A disposed on a common substrate 101A and separated by an inter-layer dielectric region 103A. Referring to FIG. 1A, the I/O transistor 102A is formed over a first fin 106A, and the logic transistor 104A is formed over a second fin 108A. In the particular example shown, the I/O transistor 102A has three relatively wider gate electrode regions 110A, 112A and 114A (cross-sectional view shows the gate length 111A as taken between source/drain regions). The underlying fin 106A can include epitaxial source/drain regions 116A, as shown. Meanwhile, the logic transistor 104A has three relatively narrower gate electrode regions 120A, 122A and 124A (cross-sectional view shows the gate length 121A as taken between source/drain regions). The underlying fin 108A can also include epitaxial source/drain regions 126A, as shown.

Referring again to FIG. 1A, at the point of processing depicted, a replacement gate process has been performed where a dummy gate material is replaced with a workfunction metal layer 118A at gate electrode regions 110A, 112A, 114A, 120A, 122A and 124A. However, the workfunction metal layer 118A is the same for the gate electrode regions of both the I/O transistor 102A and the logic transistor 104A. Therefore, in order to differentiate the effective workfunction of the I/O transistor 102A and the logic transistor 104A, approaches such as fin doping differentiation are used. It is to be understood that additional processing can subsequently be performed to complete the devices of FIG. 1A, such as gate fill, contact formation, and back-end of line (BEOL) interconnect fabrication.

Figure 1B:
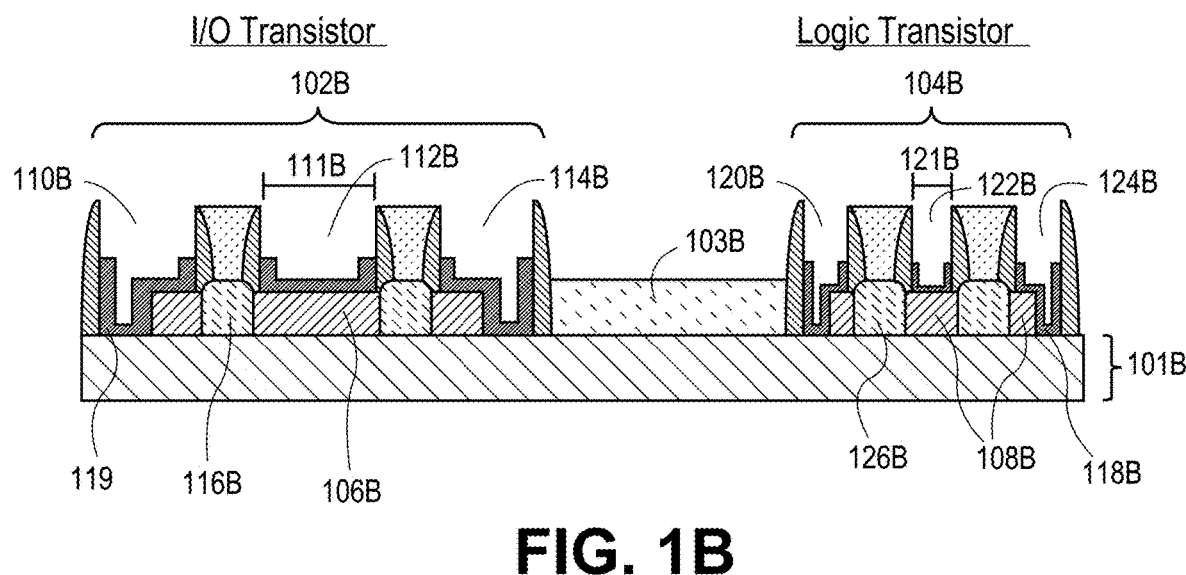
FIG. 1B illustrates a cross-sectional view of an incomplete portion of a semiconductor structure having an I/O transistor and a logic transistor disposed on a common substrate, in accordance with an embodiment of the present invention.

In contrast to the arrangement described in association with FIG. 1A, FIG. 1B illustrates a cross-sectional view of an incomplete portion of a semiconductor structure 100B having an I/O transistor 102B and a logic transistor 104B disposed on a common substrate 101B and separated by an inter-layer dielectric region 103n, in accordance with an embodiment of the present invention. Referring to FIG. 1B, the I/O transistor 102B is formed over a first fin 106n, and the logic transistor 104B is formed over a second fin 108B. In the particular example shown, the I/O transistor 102B has three relatively wider gate electrode regions 110B, 112B and 114B (cross-sectional view shows the gate length 111B as taken between source/drain regions). The underlying fin 106B can include epitaxial source/drain regions 116n, as shown. Meanwhile, the logic transistor 104B has three relatively narrower gate electrode regions 120n, 122B and 124B (cross-sectional view shows the gate length 121B as taken between source/drain regions). The underlying fin 108B can also include epitaxial source/drain regions 126n, as shown.

Referring again to FIG. 1B, at the point of processing depicted, a replacement gate process has been performed where a dummy gate material is replaced with a workfunction metal layer 118B at gate electrode regions 120B, 122B and 124B of the logic transistor 104B. However, in an embodiment, the gate electrode regions 110B, 112B and 114B of the I/O transistor 102B includes a different workfunction metal layer 119, even for the same conductivity-type device (i.e., in the case where both the I/O transistor 102B and the logic transistor 104B are N-type, or both the I/O transistor 102B and the logic transistor 104B are P-type). In an embodiment, the workfunction metal layer 119 has an actual workfunction different than the actual workfunction of the workfunction metal layer 118B. In one such embodiment, the workfunction metal layer 119 has thickness different than the thickness of the workfunction metal layer 118B (as shown). In another such embodiment, the workfunction metal layer 119 has a total material composition different than the total material composition of the workfunction metal layer 118B. In yet another embodiment, the workfunction metal layer 119 differs from the workfunction metal layer 118B in both thickness and total material composition. In a particular embodiment, the I/O transistor 102B and the logic transistor 104B are both N-type devices, and the workfunction metal layer 119 is composed of substantially the same material as the workfunction metal layer 118B but is thicker than the workfunction metal layer 118B; the actual workfunction of the workfunction metal layer 119, as compared with the actual workfunction of the workfunction metal layer 118B, is shifted towards mid-gap from N-type by an amount approximately in the range of 50-80 mVolts. It is to be understood that additional processing can subsequently be performed to complete the devices of FIG. 1B, such as gate fill, contact formation, and back-end of line (BEOL) interconnect fabrication. It is also to be understood that, although not depicted, a gate dielectric layer can be disposed between the workfunction metal layers 118B and 119 and the fins 108B and 106B, respectively.

In an aspect, a semiconductor fabrication scheme can involve fabrication of different workfunction layers for functionally different devices of like conductivity type. As an example, FIGS. 2A-2F illustrate cross-sectional view of various operations in a method of fabricating an I/O transistor and a logic transistor on a common substrate, in accordance with an embodiment of the present invention.

Figure 2A:
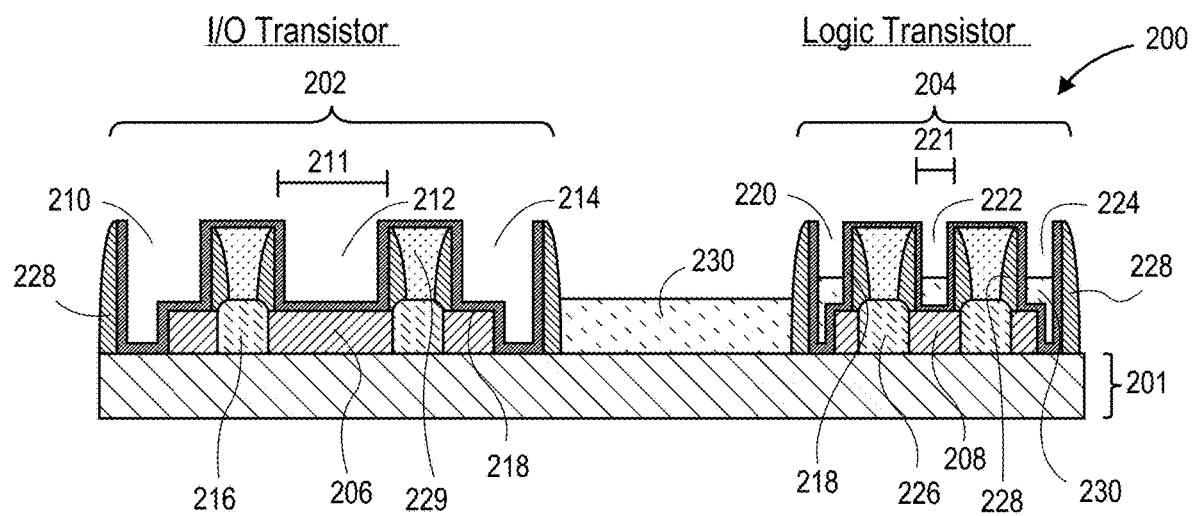
FIGS. 2A-2F illustrate cross-sectional view of various operations in a method of fabricating an I/O transistor and a logic transistor on a common substrate, in accordance with an embodiment of the present invention, where.

Referring to FIG. 2A, an incomplete portion 200 of a semiconductor structure includes an I/O transistor 202 and a logic transistor 204 disposed on a common substrate 201. The I/O transistor 202 is formed over a first fin 206, and the logic transistor 204 is formed over a second fin 208. In the particular example shown, the I/O transistor 202 has three relatively wider gate electrode regions 210, 212 and 214 (cross-sectional view shows the gate length 211 as taken between source/drain regions). The underlying fin 206 can include epitaxial source/drain regions 216, as shown. Meanwhile, the logic transistor 204 has three relatively narrower gate electrode regions 220, 222 and 224 (cross-sectional view shows the gate length 221 as taken between source/drain regions). The underlying fin 208 can also include epitaxial source/drain regions 226, as is also shown.

Referring again to FIG. 2A, at the point of processing depicted, a replacement gate process has been performed where a dummy gate material is replaced with a workfunction metal layer 218 at gate electrode regions 210, 212, 214, 220, 222 and 224. It is to be understood that, at this stage, the actual workfunction of the workfunction metal layer 218 is the same for the gate electrode regions of both the I/O transistor 202 and the logic transistor 204. In particular, the workfunction metal layer 218 is formed at the same time, and in the same process operation, for both the I/O transistor 202 and the logic transistor 204. It is also to be understood that, although not depicted, a gate dielectric layer can be disposed between the workfunction metal layer 218 and the fins 208 and 206B. Also shown in FIG. 2A are gate electrode spacers 228 and interlayer dielectric regions 229.

Referring again to FIG. 2A, a hardmask layer 230 is formed on portions of the incomplete semiconductor structure 200. In particular the hardmask layer 230 is formed between the I/O transistor 202 and the logic transistor 204 and, most importantly, within the gate electrode locations 220, 222 and 224 of the logic transistor 204. The hardmask layer 230 is however, not formed in (or is removed from) the gate electrode locations 210, 212 and 214 of the I/O transistor 202, as is depicted. In accordance with an embodiment of the present invention, the hardmask layer is first formed globally, i.e., the hardmask layer 230 is first formed between the I/O transistor 202 and the logic transistor 204, within the gate electrode locations 220, 222 and 224 of the logic transistor 204, and within the gate electrode locations 210, 212 and 214 of the I/O transistor 202. The portions of the hardmask layer 230 within the gate electrode locations 210, 212 and 214 of the I/O transistor 202 is then removed. In one such embodiment, the hardmask layer 230 is first formed globally by a spin-on process. The spin-on layer is then etched selective to other present materials and features to reduce the height of the layer. In an example, the etch rates at different feature locations can vary. As such, in one embodiment, the hardmask layer etches faster from the wider features 210, 212 and 214 than from the relatively narrower features 220, 222, and 224. Accordingly, the spin-on layer may be removed entirely from the wider features 210, 212 and 214, while a portion of the spin-on layer is retained in narrower features 220, 222, and 224, as depicted. It is to be understood that the portion of the spin-on layer between devices 202 and 204 may be removed rather than retained in the etch process. In an embodiment, the hardmask layer 230 is composed substantially of carbon and is referred to as a carbon hardmask (CHM) layer.

Figure 2B:
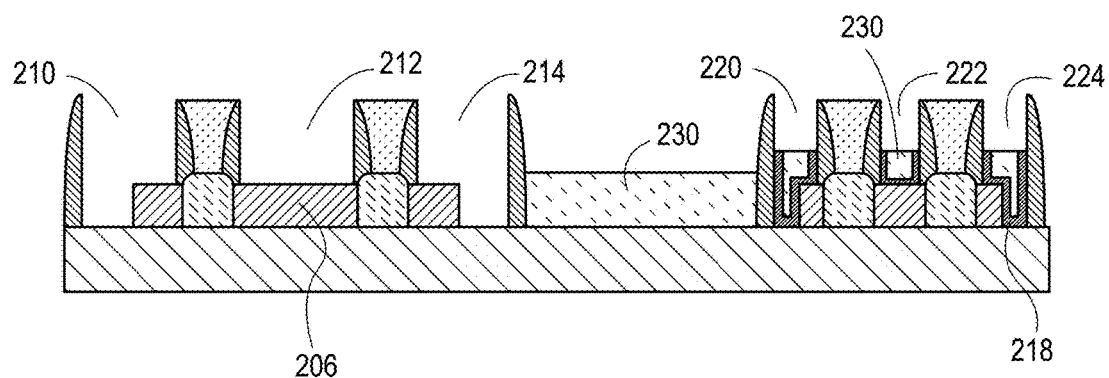

Referring to FIG. 2B, the portion of the workfunction metal layer 218 at gate electrode regions 210, 212 and 214 (i.e., at the I/O transistor 202) is removed. In an embodiment, the portion of the workfunction metal layer 218 at gate electrode regions 210, 212 and 214 is removed selective to the hardmask layer 230. In one such embodiment, at the logic transistor 204, upper portions of the workfunction metal layer 218 not protected by the hardmask layer 230 are also removed, as is depicted. Furthermore, if a gate dielectric layer is present on fin 206, it may be removed at this time, or it may be preserved. In an embodiment, the exposed portions of the workfunction metal layer 218 are removed by a selective etch process such as a wet etch process, dry etch process, or a combination thereof.

Figure 2C:
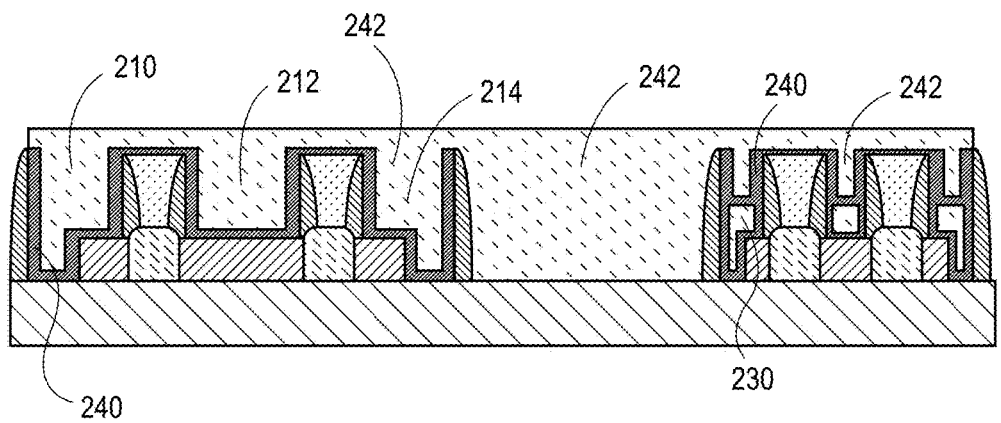

Referring to FIG. 2C, a second workfunction metal layer 240 is formed on the structure of FIG. 2B. More particularly, the second workfunction metal layer 240 is formed in the gate electrode locations 210, 212 and 214 of the I/O transistor 202. Additionally, the second workfunction metal layer 240 can be formed on the exposed portions of the workfunction metal layer 218 and the hardmask layer 230 remaining in the gate electrode locations 220, 222 and 224 of the logic transistor, as is depicted in FIG. 2C. In an embodiment, the second workfunction metal layer 240 has an actual workfunction different than the actual workfunction of the workfunction metal layer 218. In one such embodiment, the second workfunction metal layer 240 has thickness different than the thickness of the workfunction metal layer 218 (as shown). In another such embodiment, the second workfunction metal layer 240 has a total material composition different than the total material composition of the workfunction metal layer 218. In yet another embodiment, the second workfunction metal layer 240 differs from the workfunction metal layer 218 in both thickness and total material composition. In a particular embodiment, the I/O transistor 202 and the logic transistor 204 are both N-type devices, and the second workfunction metal layer 240 is composed of substantially the same material as the workfunction metal layer 218 but is thicker than the workfunction metal layer 218; the actual workfunction of the second workfunction metal layer 240, as compared with the actual workfunction of the workfunction metal layer 218, is shifted towards mid-gap from N-type by an amount approximately in the range of 50-80 mVolts.

It is to be understood that, in the case that a gate dielectric layer was removed from the I/O transistor of FIG. 2B, a gate dielectric layer may be formed immediately prior to the formation of the second workfunction metal layer 240. Referring again to FIG. 2C, a second hardmask layer 242 is then formed above the second workfunction metal layer 240. In one such embodiment, the second hardmask layer 242 is composed of the same material or substantially the same material as hardmask layer 230. For example, in one such embodiment, the second hardmask layer 242 is a carbon hardmask layer.

Figure 2D:
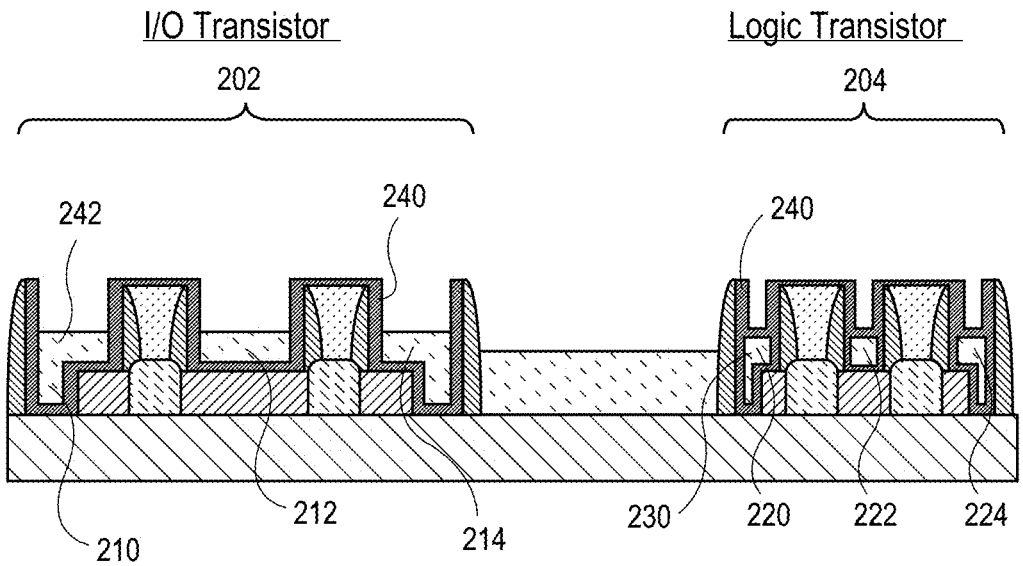

Referring to FIG. 2D, the second hardmask layer 242 is etched to recess the portions in the gate electrode regions 210, 212 and 214 of the I/O transistor 202. In the case of the logic transistor 204, the etching removes the second hardmask layer 242 from the gate electrode regions 220, 222 and 224 of the logic transistor 204. Furthermore, the recessing of the second hardmask layer 242 exposes portions of the second workfunction metal layer 240 at both the I/O transistor 202 and the logic transistor 204. In an embodiment, the second hardmask layer 242 is recessed by a selective etch process such as an ash process, wet etch process, dry etch process, or a combination thereof.

Figure 2E:
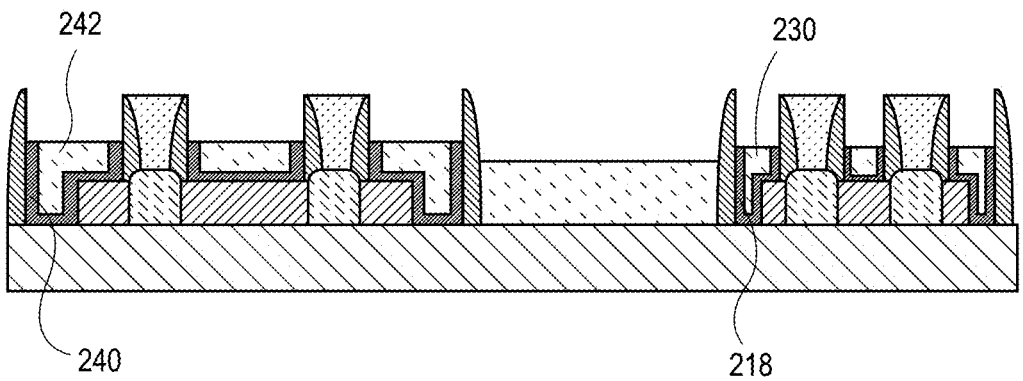

Referring to FIG. 2E, portions of the second workfunction metal layer 240 exposed upon recessing the second hardmask layer 242 are removed from both the I/O transistor 202 and the logic transistor 204. In an embodiment, the exposed portions of the second workfunction metal layer 242 are removed by a selective etch process such as a wet etch process, dry etch process, or a combination thereof.

Figure 2F:
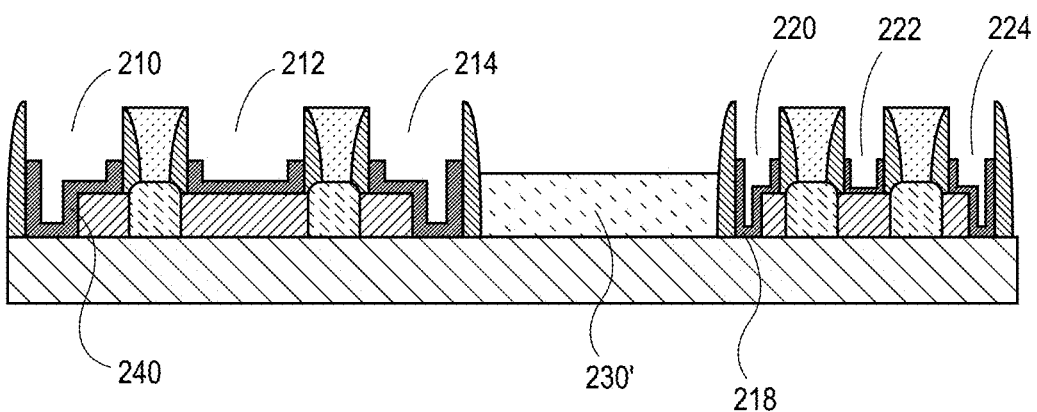

Referring to FIG. 2F, remaining portions of the hardmask layer 230 and the second hardmask layer 242 are removed. The removal exposes the formed and patterned second workfunction metal layer 240 in the gate electrode regions 210, 212, and 214 of the I/O transistor 202 and also exposes the formed and patterned workfunction metal layer 218 in the gate electrode regions 220, 222 and 224 of the logic transistor 204. In an embodiment, the remaining portions of the hardmask layer 230 and the second hardmask layer 242 are removed by a selective etch process such as an ash process, wet etch process, dry etch process, or a combination thereof. Referring again to FIG. 2F, a dielectric region 230' is shown between the transistors. Although the region 230' may be a region of preserved hardmask, this regions may also be removed and subsequently replaced with an interlayer dielectric material. It is also to be understood that additional processing can subsequently be performed to complete the devices of FIG. 2F, such as gate fill, contact formation, and back-end of line (BEOL) interconnect fabrication.

Figure 3A:
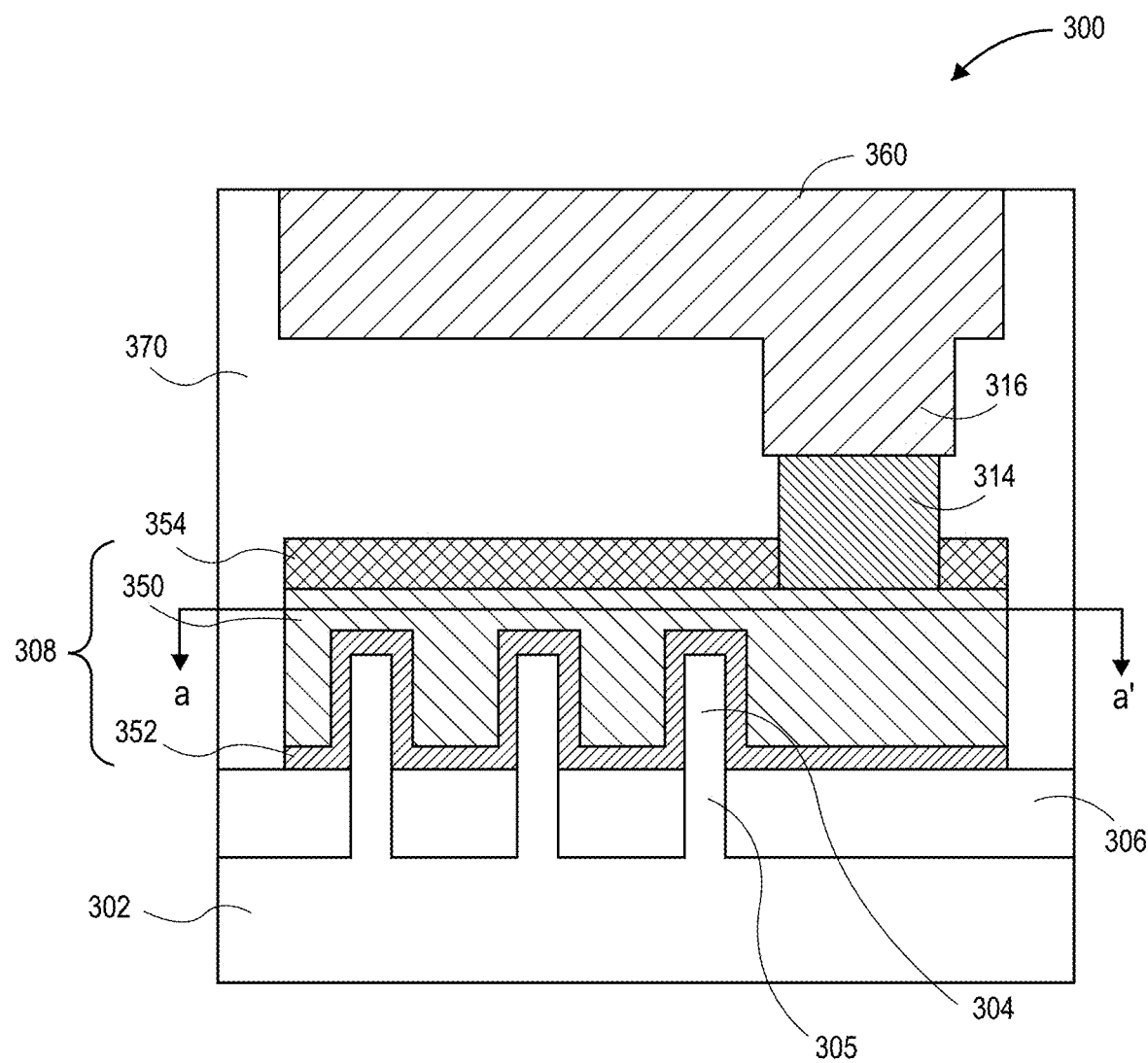
FIG. 3A illustrates a cross-sectional view of a non-planar semiconductor device, in accordance with an embodiment of the present invention.
Figure 3B:
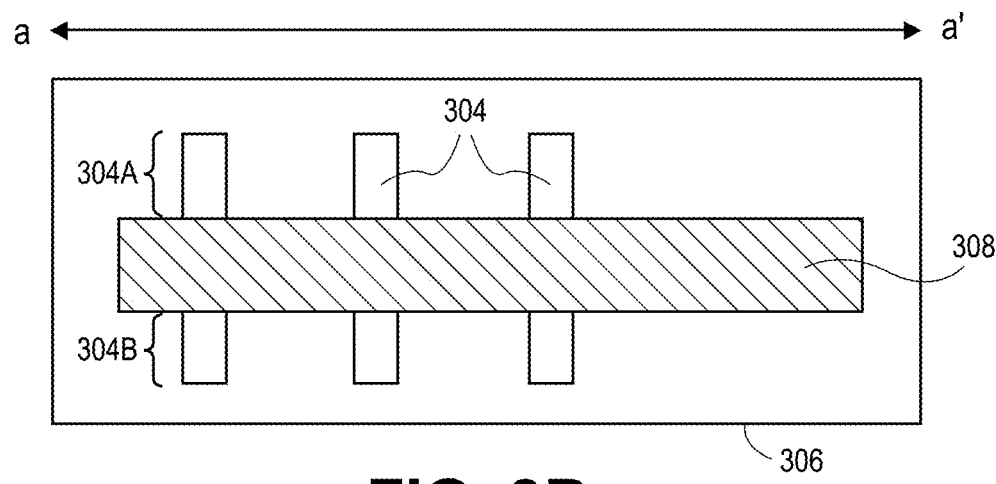
FIG. 3B illustrates a plan view taken along the a-a' axis of the semiconductor device of FIG. 3A, in accordance with an embodiment of the present invention.

In general, referring again to FIGS. 2A-2F, in an embodiment, the approach described can be used for N-type (e.g., NMOS) or P-type (e.g., PMOS), or both, device fabrication. It is to be understood that the structures resulting from the above exemplary processing scheme, e.g., the structures from FIG. 2F, may be used in a same or similar form for subsequent processing operations to complete device fabrication, such as PMOS and NMOS device fabrication. As an example of a completed device, FIGS. 3A and 3B illustrate a cross-sectional view and a plan view (taken along the a-a' axis of the cross-sectional view), respectively, of a non-planar semiconductor device such as completed versions of the I/O device 202 or the logic device 204, in accordance with an embodiment of the present invention. It is to be noted that the cross-sectional view of FIG. 3A is taken orthogonal to the cross-sectional view of FIG. 2F, as taken along any one of the gate lines 210, 212, 214, 220, 222 or 224. Furthermore, in the example, illustrated in FIGS. 3A and 3B, the gate lines cover three distinct semiconductor fins.

Referring to FIG. 3A, a semiconductor structure or device 300, such as completed versions of the I/O transistor 202 or the logic transistor 204, includes a non-planar active region (e.g., a fin structure including a protruding fin portion 304 and a sub-fin region 305) formed from a substrate 302, and within an isolation region 306.

Referring again to FIG. 3A, a gate line 308 is disposed over the protruding portions 304 of the non-planar active region as well as over a portion of the isolation region 306. As shown, gate line 308 includes a gate electrode 350 and a gate dielectric layer 352. In one embodiment, gate line 308 may also include a dielectric cap layer 354. A gate contact 314, and overlying gate contact via 316 are also seen from this perspective, along with an overlying metal interconnect 360, all of which are disposed in inter-layer dielectric stacks or layers 370. Also seen from the perspective of FIG. 3A, the gate contact 314 is, in one embodiment, disposed over isolation region 306, but not over the non-planar active regions. As shown, the fins 304 are considered to be bulk fins since they extend from the underlying substrate 302. In other embodiments, the fins are formed from a silicon-on insulator (SOI) type substrate and are thus disposed on a global insulator layer.

Referring to FIG. 3B, the gate line 308 is shown as disposed over the protruding fin portions 304. Source and drain regions 304A and 304B of the protruding fin portions 304 can be seen from this perspective. In one embodiment, the source and drain regions 304A and 304B are doped portions of original material of the protruding fin portions 304. In another embodiment, the material of the protruding fin portions 304 is removed and replaced with another semiconductor material, e.g., by epitaxial deposition. In either case, the source and drain regions 304A and 304B may extend below the height of dielectric layer 306, i.e., into the sub-fin region 305, in the case of bulk type devices. Alternatively, the source and drain regions 304A and 304B do not extend below the height of dielectric layer 306, and are either above or co-planar with the height of dielectric layer 306.

In an embodiment, the semiconductor structure or device 300 is a non-planar device such as, but not limited to, a fin-FET or a tri-gate or similar device. In such an embodiment, a corresponding semiconducting channel region is composed of or is formed in a three-dimensional body. In one such embodiment, the gate electrode stacks of gate lines 308 surround at least a top surface and a pair of sidewalls of the three-dimensional body, as depicted in FIG. 3A.

Substrates 201 and 302 described in association with FIGS. 2A-2F and 3A, respectively, may be composed of a semiconductor material that can withstand a manufacturing process and in which charge can migrate. In an embodiment, substrate 201 or 302 is a bulk substrate composed of a crystalline silicon, silicon/germanium or germanium layer doped with a charge carrier, such as but not limited to phosphorus, arsenic, boron or a combination thereof. In one embodiment, the concentration of silicon atoms in bulk substrate 201 or 302 is greater than 97%. In another embodiment, bulk substrate 201 or 302 is composed of an epitaxial layer grown atop a distinct crystalline substrate, e.g. a silicon epitaxial layer grown atop a boron-doped bulk silicon monocrystalline substrate. Bulk substrate 201 or 302 may alternatively be composed of a group III-V material. In an embodiment, bulk substrate 201 or 302 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 201 or 302 is composed of a III-V material and the charge-carrier dopant impurity atoms are ones such as, but not limited to, carbon, silicon, germanium, oxygen, sulfur, selenium or tellurium. Alternatively, in place of a bulk substrate, a silicon-on-insulator (SOI) substrate may be used. In such a case, the region 201 depicted in FIGS. 2A-2F is a global isolation layer.

Isolation region 306 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 306 is composed of a dielectric material such as, but not limited to, silicon dioxide, silicon oxy-nitride, silicon nitride, or carbon-doped silicon nitride.

Gate line 308 may be composed of a gate electrode stack which includes a gate dielectric layer 352 and a gate electrode layer 350 (such as workfunction metal layer 218 or 240). In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 302. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode layer 350 (such as workfunction metal layer 218 or 240) is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks (shown as 228 in FIGS. 2A-2F) may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment, the gate line 308 (or lines 210, 212, 214, 220, 222 and 224) are first formed by poly gate patterning involving poly lithography to define the poly gate by etch of an SiN hardmask and poly subsequently. In one embodiment, a mask is formed on the hardmask layer, the mask composed of a topographic masking portion and an anti-reflective coating (ARC) layer. In a particular such embodiment, the topographic masking portion is a carbon hardmask (CHM) layer and the anti-reflective coating layer is a silicon ARC layer. The topographic masking portion and the ARC layer may be patterned with conventional lithography and etching process techniques. In one embodiment, the mask also includes and uppermost photo-resist layer, as is known in the art, and may be patterned by conventional lithography and development processes. In a particular embodiment, the portions of the photo-resist layer exposed to the light source are removed upon developing the photo-resist layer. Thus, patterned photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another particular embodiment, the portions of the photo-resist layer exposed to the light source are retained upon developing the photo-resist layer. Thus, the photo-resist layer is composed of a negative photo-resist material. In a specific embodiment, the photo-resist layer is composed of a negative photo-resist material such as, but not limited to, consisting of poly-cis-isoprene or poly-vinyl-cinnamate.

Furthermore, as mentioned briefly in association with FIG. 2A, the gate stack structure 308 (and gates electrode locations 210, 212, 214, 220, 222 and 224) may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius.

Referring again to FIG. 3A, the arrangement of semiconductor structure or device 300 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly(gate) grid with separate patterning of contact features.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor field effect transistors (MOS) transistors for logic or memory, or are bipolar transistors. Also, in an embodiment, the semiconductor devices have a three-dimensional architecture, such as a fin-FET device, a trigate device, or an independently accessed double gate device. One or more embodiments may be particularly useful for devices included in a system-on-chip (SoC) product. Additionally, it is to be understood that the processing scheme described in association with FIGS. 2A-2F could also be applicable to planar device fabrication.

Overall, embodiments described herein provide approaches to fabricate different workfunctions for different devices. One or more embodiments enhances the ability to target the performance of each device independently without the extra cost of additional mask operations.

Figure 4:
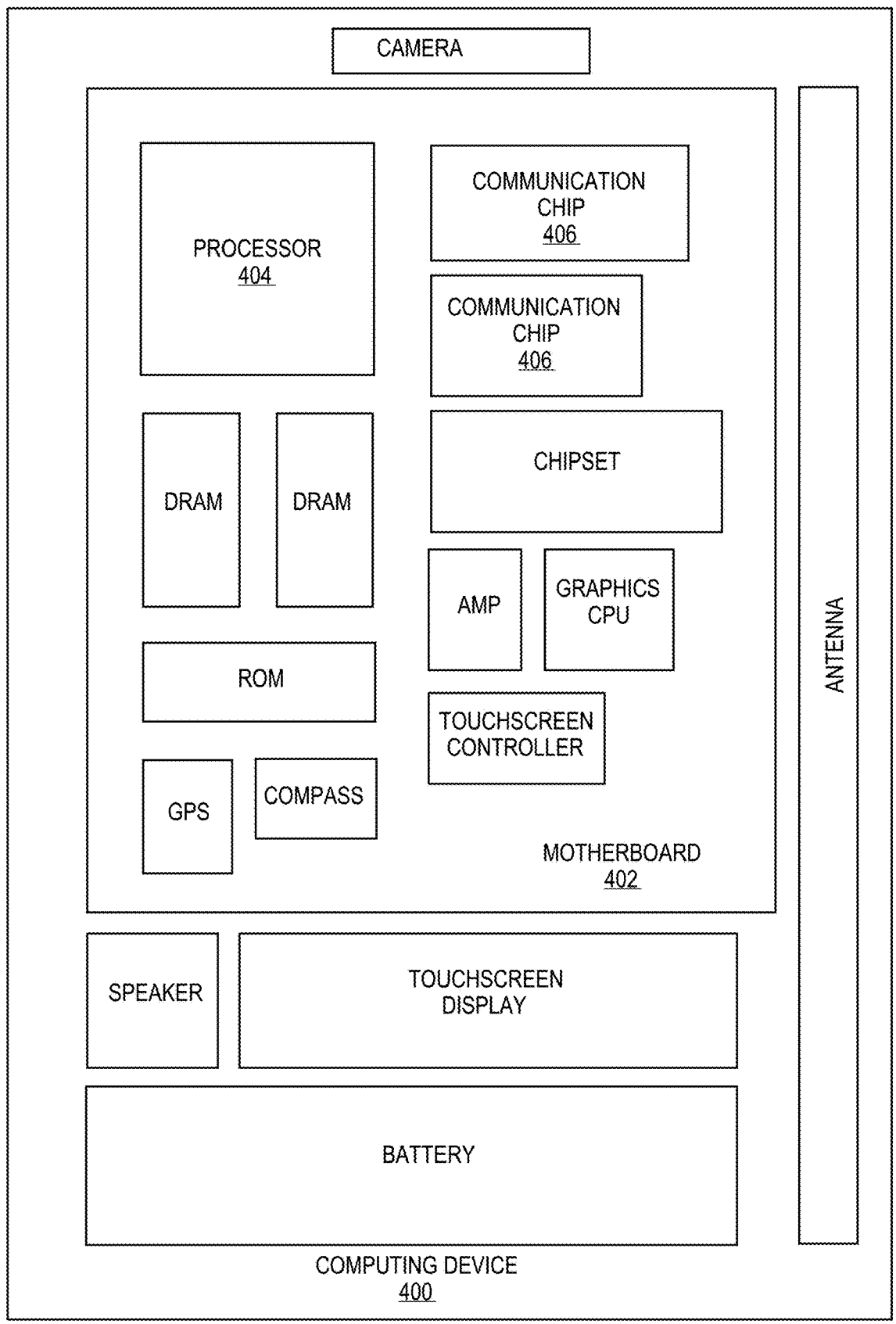
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of embodiments of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of embodiments of the invention.

In various embodiments, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Thus, embodiments of the present invention include non-planar I/O and logic semiconductor devices having different workfunctions on common substrates and methods of fabricating non-planar I/O and logic semiconductor devices having different workfunctions on common substrates.

In an embodiment, a semiconductor structure includes a first semiconductor device disposed above a substrate. The first semiconductor device has a conductivity type and includes a gate electrode having a first workfunction. The semiconductor structure also includes a second semiconductor device disposed above the substrate. The second semiconductor device has the conductivity type and includes a gate electrode having a second, different, workfunction.

In one embodiment, the first semiconductor device is an I/O transistor, and the second semiconductor device is a logic transistor.

In one embodiment, the gate electrode having the first workfunction includes a first workfunction metal layer having a thickness, the gate electrode having the second workfunction includes a second workfunction metal layer having a thickness, and the thickness of the first workfunction metal layer is different than the thickness of the second workfunction metal layer.

In one embodiment, the gate electrode having the first workfunction includes a first workfunction metal layer having a total material composition, the gate electrode having the second workfunction includes a second workfunction metal layer having a total material composition, and the total material composition of the first workfunction metal layer is different than the total material composition of the second workfunction metal layer.

In one embodiment, the gate electrode having the first workfunction includes a first workfunction metal layer having a total material composition and a thickness, the gate electrode having the second workfunction includes a second workfunction metal layer having a total material composition and a thickness, and both the total material composition and the thickness of the first workfunction metal layer are different than the total material composition and the thickness of the second workfunction metal layer.

In one embodiment, the conductivity type is N-type.

In one embodiment, the gate electrode having the first workfunction includes a first workfunction metal layer having a thickness, the gate electrode having the second workfunction includes a second workfunction metal layer having a thickness. The thickness of the first workfunction metal layer is greater than the thickness of the second workfunction metal layer, and the first workfunction is closer to mid-gap than the second workfunction by an amount approximately in the range of 50-80 mVolts.

In one embodiment, the gate electrode of the first semiconductor device has a gate length different than a gate length of the gate electrode of the second semiconductor device.

In one embodiment, both the first and second semiconductor devices are fin-FET or tri-gate devices.

In an embodiment, a system-on-chip (SoC) integrated circuit includes an N-type I/O transistor disposed above a substrate, the N-type I/O transistor including a gate electrode having a first workfunction and a first gate length. An N-type logic transistor is disposed above the substrate, the N-type logic transistor including a gate electrode having a second, lower, workfunction and having a second gate length less than the first gate length.

In one embodiment, the gate electrode having the first workfunction includes a first workfunction metal layer having a thickness, the gate electrode having the second workfunction includes a second workfunction metal layer having a thickness, and the thickness of the first workfunction metal layer is greater than the thickness of the second workfunction metal layer.

In one embodiment, the gate electrode having the first workfunction includes a first workfunction metal layer having a total material composition, the gate electrode having the second workfunction includes a second workfunction metal layer having a total material composition, and the total material composition of the first workfunction metal layer is different than the total material composition of the second workfunction metal layer.

In one embodiment, the gate electrode having the first workfunction includes a first workfunction metal layer having a total material composition and a thickness, the gate electrode having the second workfunction includes a second workfunction metal layer having a total material composition and a thickness, and both the total material composition and the thickness of the first workfunction metal layer are different than the total material composition and the thickness of the second workfunction metal layer.

In one embodiment, the first workfunction is closer to mid-gap than the second workfunction by an amount approximately in the range of 50-80 mVolts.

In one embodiment, both the first and second semiconductor devices are fin-FET or tri-gate devices.

In an embodiment, a method of fabricating a semiconductor structure involves forming a first semiconductor fin and a second semiconductor fin above a substrate. The method also involves forming a first plurality of gate lines having a first pitch over the first semiconductor fin and forming a second plurality of gate lines having a second, narrower, pitch over the second semiconductor fin, both of the first and second pluralities of gate lines including a first workfunction metal layer of a conductivity type. The method also involves replacing the first workfunction metal layer of the conductivity type with a second workfunction metal layer of the conductivity type in the first plurality of gate lines but not in the second plurality of gate lines.

In one embodiment, forming the first plurality of gate lines and the second plurality of gate lines involves using a replacement gate technique.

In one embodiment, replacing the first workfunction metal layer of the conductivity type with the second workfunction metal layer of the conductivity type involves masking a portion of the first workfunction metal layer of the conductivity type in the second plurality of gate lines, but not in the first plurality of gate lines.

In one embodiment, masking the portion of the first workfunction metal layer of the conductivity type in the second plurality of gate lines involves forming and etching a carbon hardmask. The etch rate of the carbon hardmask in the second plurality of gate lines is slower than the etch rate of the carbon hardmask in the first plurality of gate lines.

In one embodiment, replacing the first workfunction metal layer of the conductivity type with the second workfunction metal layer of the conductivity type involves etching the first workfunction metal layer of the conductivity type and forming the second workfunction metal layer of the conductivity type with a thickness greater than a thickness of the first workfunction metal layer of the conductivity type.

In one embodiment, the method further involves forming an I/O transistor from the first semiconductor fin and the first plurality of gate lines. The method also involves forming a logic transistor from the second semiconductor fin and the second plurality of gate lines.

In one embodiment, forming the I/O transistor involves forming an N-type I/O transistor, and forming the logic transistor involves forming an N-type logic transistor.

What is claimed is:

1. An integrated circuit structure, comprising:
   a first N-type device having a three-dimensional architecture, the first N-type device having a first three-dimensional body, the first three-dimensional body having a sidewall at an end of the three-dimensional body, and the first N-type device comprising a first gate electrode over the end of the first three-dimensional body and adjacent to the sidewall of the first three-dimensional body, and a second gate electrode over the first three-dimensional body and spaced apart from the first gate electrode, wherein the second gate electrode has a first gate length; and
   a second N-type device having a three-dimensional architecture, the second N-type device having a second three-dimensional body, and the second N-type device comprising a third gate electrode over the second three-dimensional body, wherein the third gate electrode has a second gate length different than the first gate length, and wherein the third gate electrode has a workfunction layer having a thickness different than a thickness of a workfunction layer of the second gate electrode.

2. The integrated circuit structure of claim 1, wherein the second gate length is less than the first gate length.

3. The integrated circuit structure of claim 1, wherein the thickness of the workfunction layer of the third gate electrode is less than the thickness of the workfunction layer of the second gate electrode.

4. The integrated circuit structure of claim 1, wherein the first N-type device is a logic transistor, and the second N-type device is an I/O transistor.

5. The integrated circuit structure of claim 1, further comprising:
   a first gate dielectric between the first three-dimensional body and the first gate electrode;
   a second gate dielectric between the first three-dimensional body and the second gate electrode; and
   a third gate dielectric between the second three-dimensional body and the third gate electrode.

6. The integrated circuit structure of claim 1, further comprising a fourth gate electrode over an end of the second three-dimensional body and adjacent to a sidewall of the second three-dimensional body.

7. An integrated circuit structure, comprising:
   a first P-type device having a three-dimensional architecture, the first P-type device having a first three-dimensional body, the first three-dimensional body having a sidewall at an end of the three-dimensional body, and the first P-type device comprising a first gate electrode over the end of the first three-dimensional body and adjacent to the sidewall of the first three-dimensional body, and a second gate electrode over the first three-dimensional body and spaced apart from the first gate electrode, wherein the second gate electrode has a first gate length; and a second P-type device having a three-dimensional architecture, the second P-type device having a second three-dimensional body, and the second P-type device comprising a third gate electrode over the second three-dimensional body, wherein the third gate electrode has a second gate length different than the first gate length, and wherein the third gate electrode has a workfunction layer having a thickness different than a thickness of a workfunction layer of the second gate electrode.

8. The integrated circuit structure of claim 7, wherein the second gate length is less than the first gate length.

9. The integrated circuit structure of claim 7, wherein the thickness of the workfunction layer of the third gate electrode is less than the thickness of the workfunction layer of the second gate electrode.

10. The integrated circuit structure of claim 7, wherein the first P-type device is a logic transistor, and the second P-type device is an I/O transistor.

11. The integrated circuit structure of claim 7, further comprising:
a first gate dielectric between the first three-dimensional body and the first gate electrode;
a second gate dielectric between the first three-dimensional body and the second gate electrode; and
a third gate dielectric between the second three-dimensional body and the third gate electrode.

12. The integrated circuit structure of claim 7, further comprising a fourth gate electrode over an end of the second three-dimensional body and adjacent to a sidewall of the second three-dimensional body.

13. A computing system, comprising:
a board; and
a component coupled to the board, the component including an integrated circuit structure, comprising:
a first device having a three-dimensional architecture, the first device of a conductivity type, the first device having a first three-dimensional body, the first three-dimensional body having a sidewall at an end of the three-dimensional body, and the first device comprising a first gate electrode over the end of the first three-dimensional body and adjacent to the sidewall of the first three-dimensional body, and a second gate electrode over the first three-dimensional body and spaced apart from the first gate electrode, wherein the second gate electrode has a first gate length; and
a second device having a three-dimensional architecture, the second device of the conductivity type, the second device having a second three-dimensional body, and the second device comprising a third gate electrode over the second three-dimensional body, wherein the third gate electrode has a second gate length different than the first gate length, and wherein the third gate electrode has a workfunction layer having a thickness different than a thickness of a workfunction layer of the second gate electrode.

14. The computing system of claim 13, wherein the conductivity type is N-type.

15. The computing system of claim 13, wherein the conductivity type is P-type.

16. The computing system of claim 13, further comprising:
a memory coupled to the board.

17. The computing system of claim 13, further comprising:
a communication chip coupled to the board.

18. The computing system of claim 13, further comprising:
a camera coupled to the board.

19. The computing system of claim 13, further comprising:
a battery coupled to the board.

20. The computing system of claim 13, wherein the component is selected from the group consisting of a processor, a communications chip, and a digital signal processor.

* * * * *